(12) United States Patent
Tatsuda et al.

(10) Patent No.: US 11,062,871 B2
(45) Date of Patent: Jul. 13, 2021

(54) ANALOG AMPLIFICATION VACUUM TUBE

(71) Applicants: NORITAKE CO., LIMITED, Aichi (JP); NORITAKE ITRON CORPORATION, Mie (JP)

(72) Inventors: Kazunori Tatsuda, Mie (JP); Takehiro Nakao, Mie (JP); Tomotaka Ezaki, Mie (JP)

(73) Assignees: NORITAKE CO., LIMITED, Aichi (JP); NORITAKE ITRON CORPORATION, Mie (JP)

( * ) Notice: Subject to any disclaimer, the term of this patent is extended or adjusted under 35 U.S.C. 154(b) by 0 days.

(21) Appl. No.: 16/957,460

(22) PCT Filed: Jan. 10, 2019

(86) PCT No.: PCT/JP2019/000500
§ 371 (c)(1),
(2) Date: Jun. 24, 2020

(87) PCT Pub. No.: WO2019/139074
PCT Pub. Date: Jul. 18, 2019

(65) Prior Publication Data
US 2020/0328057 A1    Oct. 15, 2020

(30) Foreign Application Priority Data
Jan. 12, 2018    (JP) .............................. JP2018-003162

(51) Int. Cl.
*H01J 19/12*    (2006.01)
*H01J 19/42*    (2006.01)
(Continued)

(52) U.S. Cl.
CPC .............. *H01J 19/12* (2013.01); *H01J 19/42* (2013.01); *H01J 21/22* (2013.01); *H03F 1/33* (2013.01)

(58) Field of Classification Search
CPC . H01J 19/12; H01J 19/42; H01J 21/22; H03F 1/33
See application file for complete search history.

(56) References Cited

U.S. PATENT DOCUMENTS 9,620,323 B1 *    4/2017    Tatsuda ................... H01J 19/38
2016/0211106 A1 *   7/2016    Tatsuda ................... H01J 19/70
(Continued)

FOREIGN PATENT DOCUMENTS

JP    H03-40346      2/1991
JP    2007-188848    7/2007
(Continued)

OTHER PUBLICATIONS

International Search Report issued in WIPO Patent Application No. PCT/JP2019/000500, dated Mar. 26, 2019.

*Primary Examiner* — Donald L Raleigh
(74) *Attorney, Agent, or Firm* — Greenblum & Bernstein, P.L.C.

(57) ABSTRACT

An analog amplification vacuum tube of the present invention suppresses influences of filament vibration on amplification characteristics. The analog amplification vacuum tube of the present invention is provided with a filament, an anode, a grid and a vibration-proof part. The filament is tensioned linearly and emits thermal electrons. The anode is disposed parallel to the filament. The grid is disposed between the filament and the anode so as to face the anode. The vibration-proof part includes a thin film usable in a vacuum environment and the thin film comes into contact with part of the filament.

10 Claims, 7 Drawing Sheets

(51) Int. Cl.
    *H01J 21/22*     (2006.01)
    *H03F 1/33*     (2006.01)

(56) References Cited

U.S. PATENT DOCUMENTS

2016/0211107 A1    7/2016    Tatsuda et al.
2017/0103867 A1    4/2017    Tatsuda et al.

FOREIGN PATENT DOCUMENTS

| JP | 2007188848 A | * | 7/2007 | ............. H01J 31/15 |
| JP | 2016-134298 | | 7/2016 | |
| JP | 2016-134299 | | 7/2016 | |

* cited by examiner

ANALOG AMPLIFICATION VACUUM TUBE

TECHNICAL FIELD

The present invention relates to an analog amplification vacuum tube that operates as an analog amplifier.

BACKGROUND ART

Since there are requests from users who prefer characteristics of vacuum tubes mainly in the music industry, there are demands for vacuum tubes used as analog amplifiers, and there exist vacuum tubes that can be used as such analog amplifiers. However, production volume of vacuum tubes is decreasing, there are problems of increase in price and difficulty in availability. On the other hand, vacuum fluorescent displays, which are a kind of vacuum tubes, inexpensive and popular, are difficult to use for analog amplification. Techniques described in Patent literatures 1 and 2 are known as techniques that can provide vacuum tubes having a structure similar to inexpensive and easily available vacuum fluorescent displays and that can be easily operated as analog amplifiers.

PRIOR ART LITERATURE

Patent Literature

Patent literature 1: Japanese Patent Application Laid-Open No. 2016-134298
Patent literature 2: Japanese Patent Application Laid-Open No. 2016-134299

SUMMARY OF THE INVENTION

Problems to be Solved by the Invention

However, the techniques described in Patent literatures 1 and 2 involve a problem that filament vibration is likely to affect amplification characteristics.

It is therefore an object of the present invention to suppress influences of filament vibration on amplification characteristics.

Means to Solve the Problems

An analog amplification vacuum tube of the present invention is provided with a filament, an anode, a grid and a vibration-proof part. The filament is tensioned linearly and emits thermal electrons. The anode is disposed parallel to the filament. The grid is disposed between the filament and the anode so as to face the anode. The vibration-proof part includes a thin film usable in a vacuum environment and the thin film comes into contact with part of the filament.

Effects of the Invention

According to features of the analog amplification vacuum tube of the present invention, an attenuation factor of filament vibration can be increased and influences of the filament vibration on amplification characteristics can be thereby reduced.

DETAILED DESCRIPTION OF THE EMBODIMENT

Figure 1:
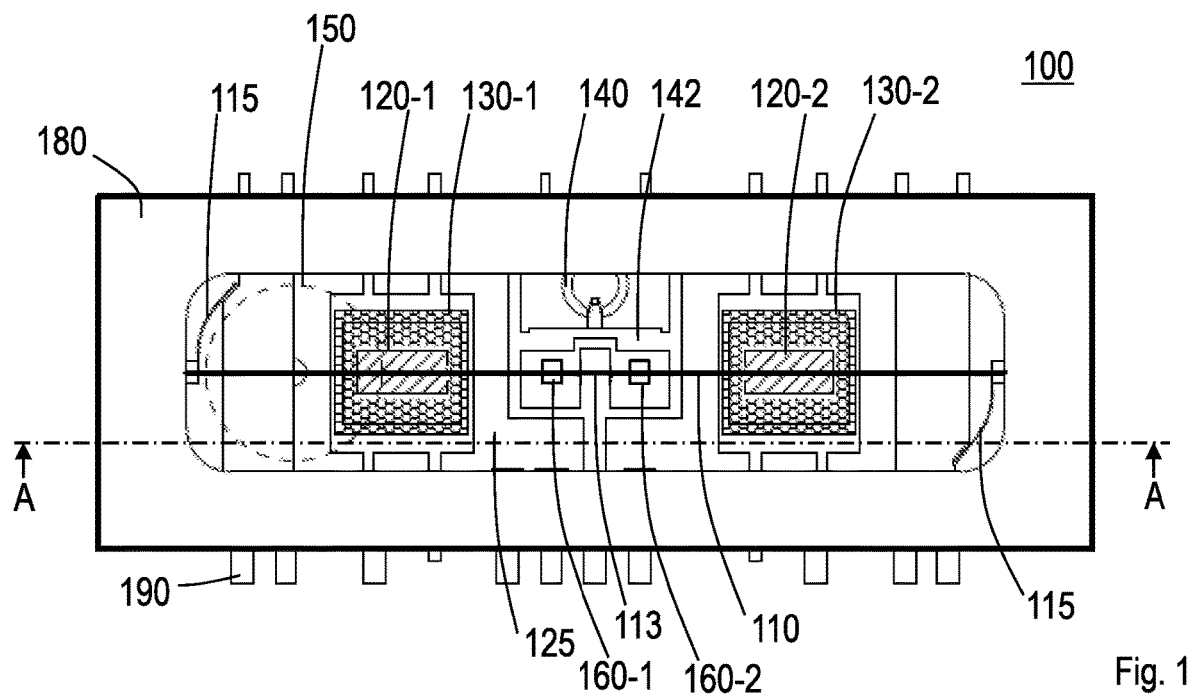
FIG. 1 is a plan view of an analog amplification vacuum tube of a first embodiment.

Hereinafter, an embodiment of the present invention will be described in detail. Note that components having the same functions are assigned the same reference numerals and duplicate description thereof is omitted.

First Embodiment

Figure 2:
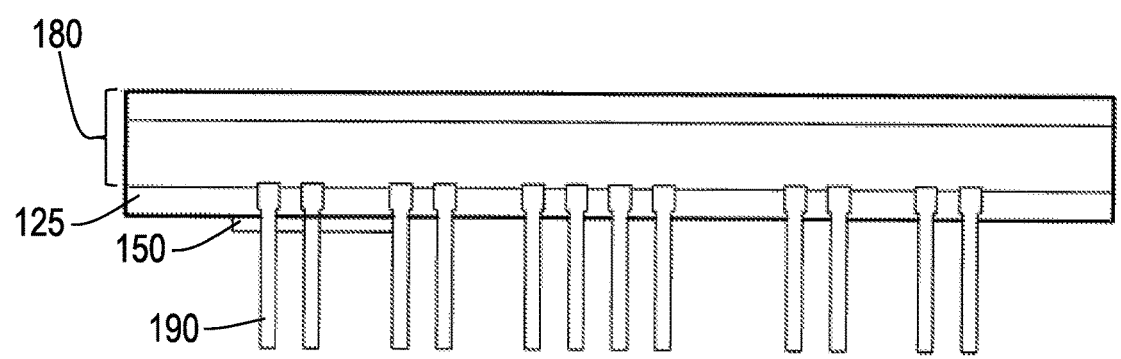
FIG. 2 is a front view of the analog amplification vacuum tube of the first embodiment.
Figure 3:
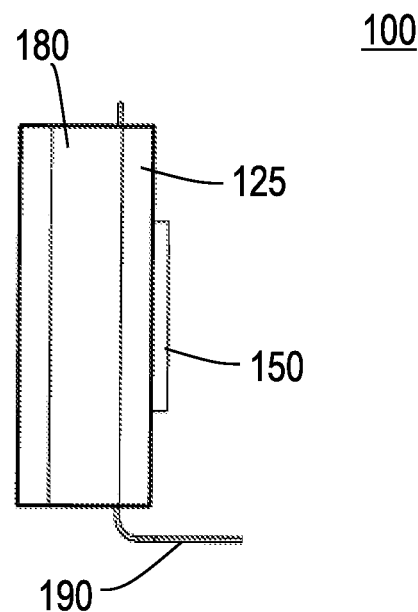
FIG. 3 is a side view of the analog amplification vacuum tube of the first embodiment.
Figure 4:
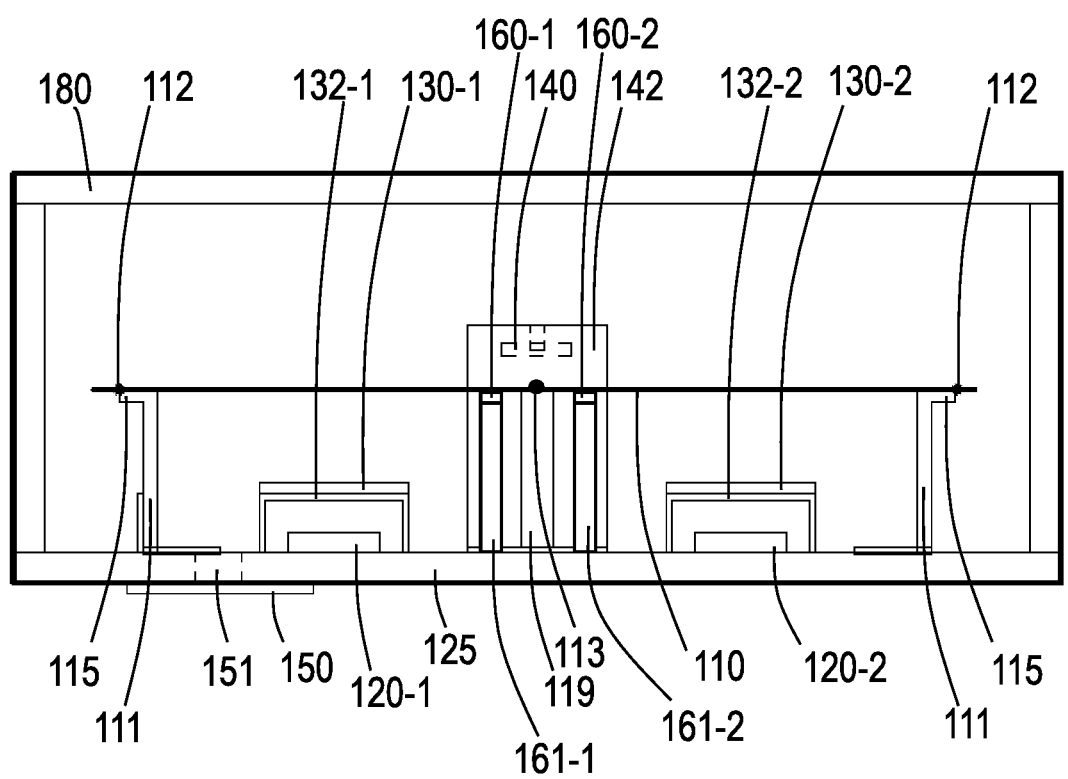
FIG. 4 is a cross-sectional view along a line A-A in FIG. 1.

<Configuration of Analog Amplification Vacuum Tube>
FIG. 1 illustrates a plan view of an analog amplification vacuum tube of the present invention, FIG. 2 illustrates a front view, FIG. 3 illustrates a side view and FIG. 4 illustrates a cross-sectional view along a line A-A in FIG. 1. The analog amplification vacuum tube 100 includes a filament 110 tensioned linearly and emitting thermalelectrons at a predetermined temperature or higher, two sets of a grid 130-1 and 130-2, an anode 120-1 and 120-2, and vibration-proof parts 160-1 and 160-2. Both of the anodes 120-1 and 120-2 are formed on the same surface of a planar substrate (glass substrate 125). The filament 110 is disposed parallel to the planar substrate (glass substrate 125) at a position facing both of the anodes 120-1 and 120-2. Each of the grids 130-1 and 130-2 faces the same set of anodes 120-1 and 120-2 at a first predetermined distance and is disposed between the anode 120-1 or 120-2 and the filament 110 so as to keep a second predetermined distance from the filament 110. The analog amplification vacuum tube 100 is provided with an intermediate filament fixing part 113 that fixes the filament 110 at a position corresponding to an intermediate point between the anodes 120-1 and 120-2 of the two sets. Furthermore, the analog amplification vacuum tube 100 can be made easier to use for analog amplification if the first predetermined distance is set to 0.15 mm or more and 0.35 mm or less and the second predetermined distance is set to 0.2 mm or more and 0.6 mm or less. Note that in FIG. 1, parts of the grids 130-1 and 130-2 are not described so that the positions of the anodes 120-1 and 120-2 are made clear. In the actual analog amplification vacuum tube 100, since the mesh-like grids 130-1 and 130-2 (see FIG. 9) exist above the anodes 120-1 and 120-2, the anodes 120-1 and 120-2 are hard to see.

Figure 5:
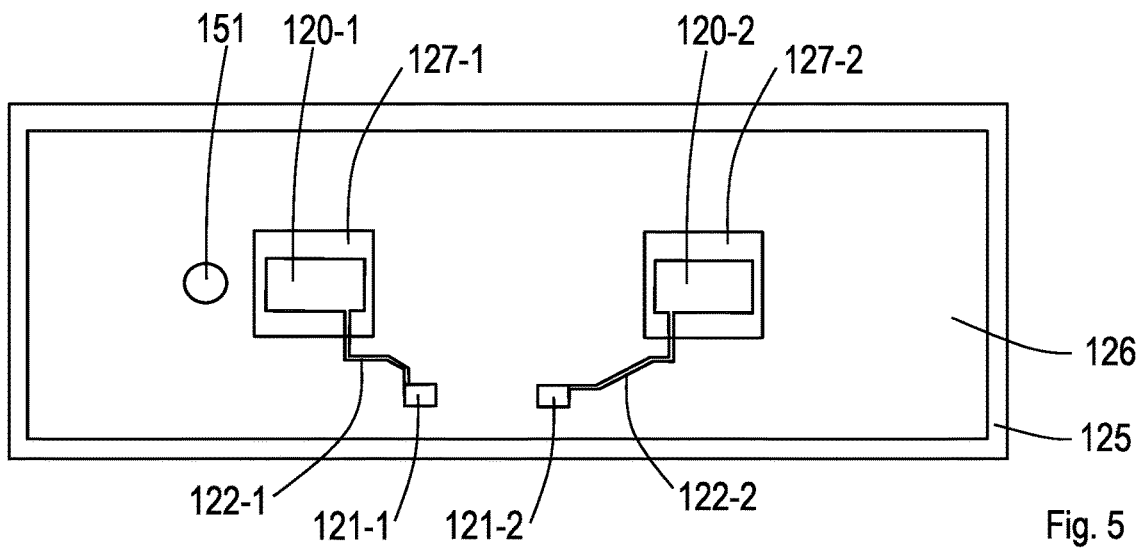
FIG. 5 is a diagram illustrating an anode and an insulating layer formed on a glass substrate.
Figure 6:
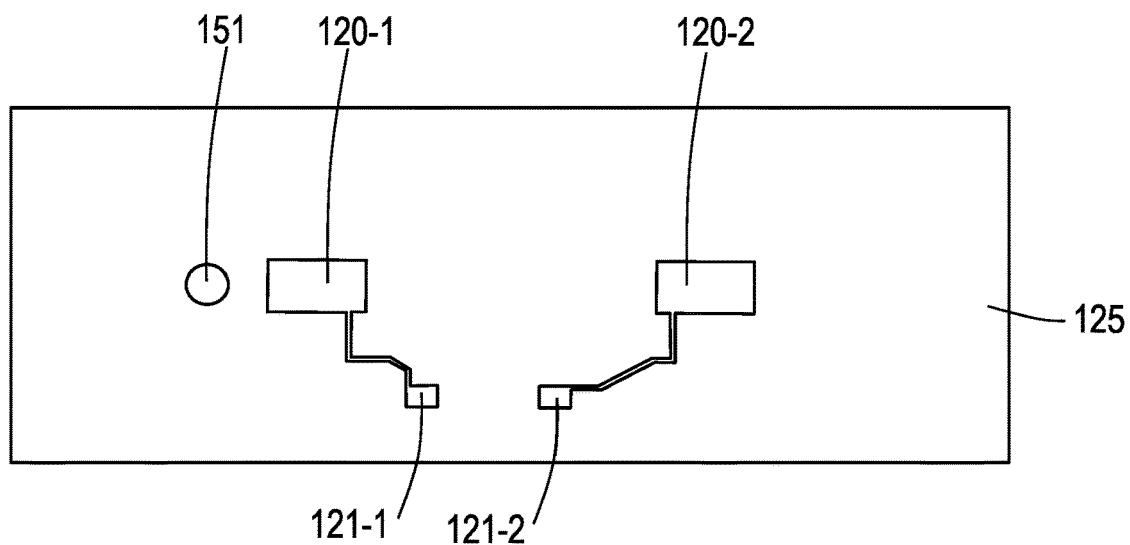
FIG. 6 is a diagram illustrating the anode formed on the glass substrate.
Figure 7:
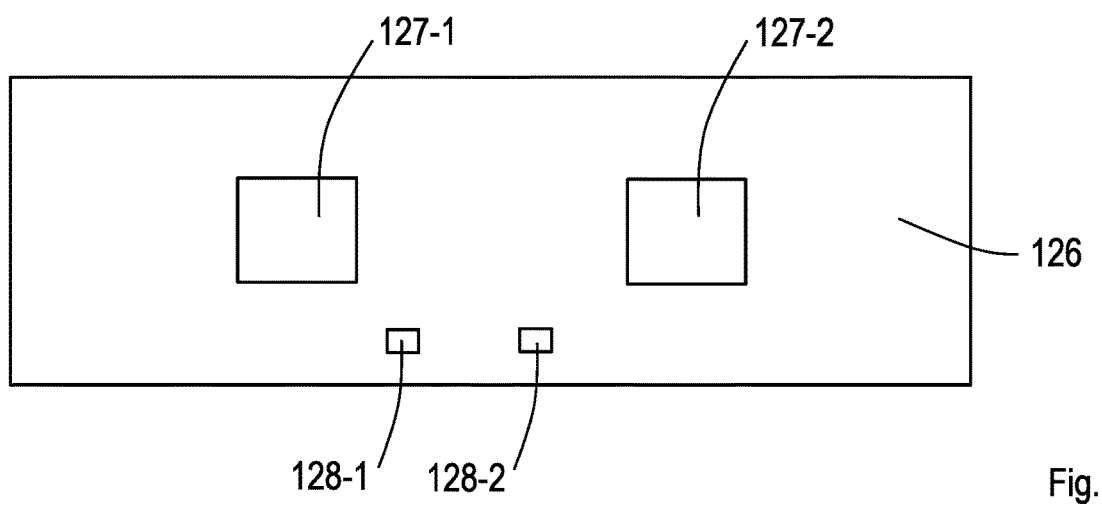
FIG. 7 is a diagram illustrating a shape of the insulating layer.

Next, a specific example of the structure for realizing the above features will be described. FIG. 5 illustrates the anodes 120-1 and 120-2, and an insulating layer formed on a glass substrate. FIG. 6 is a diagram illustrating the anodes 120-1 and 120-2 formed on the glass substrate, and FIG. 7 is a diagram illustrating a shape of the insulating layer. A glass substrate 125 includes an exhaust hole 151 and the anodes 120-1 and 120-2 are formed on one side of the glass substrate 125. Anode terminals 121-1 and 121-2 are connected to the anodes 120-1 and 120-2 via anode wirings 122-1 and 122-2. The anodes 120-1 and 120-2 may be made of, for example, an aluminum thin film. For example, low melting point glass may be used for the insulating layer 126, which includes anode openings 127-1 and 127-2, and terminal openings 128-1 and 128-2. The analog amplification vacuum tube 100 seals a case 180 and the glass substrate 125, evacuates air from the exhaust hole 151 and thereby creates a vacuum inside. An exhaust hole plug 150 is fitted into the exhaust hole 151. Though not shown in FIG. 5, low melting point glass for sealing may be further disposed in a part of the glass substrate 125, which is in contact with the case 180. Electrical contact with the outside is made by a terminal 190.

Figure 8:
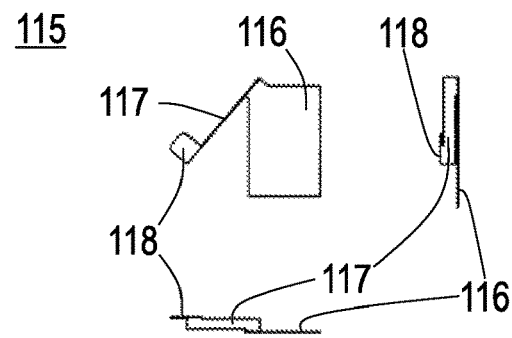
FIG. 8 is a trihedral figure (plan view, front view, side view) of an anchor.

The filament 110 is a directly heated cathode. For example, the filament 110 may be coated with barium oxide so as to emit thermalelectrons by applying a DC current thereto, to heat the filament 110 to on the order of 650 degrees. In this example, although the above "predetermined temperature or higher" is 650 degrees, the temperature is not limited to 650 degrees. FIG. 8 illustrates a trihedral figure (plan view, front view, side view) of an anchor 115 to provide tension to the filament 110. One end of a plate spring 117 is disposed at part of an anchor body 116 and the other end of the plate spring 117 is a filament fixing part 118. A SUS (stainless steel material) or the like may be used for the anchor 115. The anchor 115 is attached to a filament support member 111 and the filament 110 is fixed to the filament fixing part 118 of the anchor 115 by welding or the like. Reference numeral 112 in FIG. 4 denotes a welding point. The anchor body 116 is a member where a positional relationship with the anode 120-1 or 120-2 is constant and the welding point 112 is a movable part of the filament 110 fixed to the anchor body 116 via the plate spring 117, which is an elastic body.

An intermediate filament support member 119 is attached at a position corresponding to an intermediate point between the anodes of the two sets. An intermediate filament fixing part 113 is formed by fixing the filament 110 to the intermediate filament support member 119 by welding or the like. The intermediate filament fixing part 113 is a fixing part of the filament 110, where the positional relationship with the anode 120-1 or 120-2 is constant. The distance between the filament 110 and the anode 120-1 or 120-2 is determined by a length between the filament support member 111 and the filament intermediate support member 119 and the tension of the filament 110 can be adjusted by the plate spring 117 of the anchor 115.

The vibration-proof parts 160-1 and 160-2 are attached to the vibration-proof support members 161-1 and 161-2. The vibration-proof parts 160-1 and 160-2 may be attached to the vibration-proof support members 161-1 and 161-2 by mechanically fixing those parts or using a heat-resisting ceramic-based adhesive or polyimide-based adhesive or the like.

The vibration-proof parts 160-1 and 160-2 include a thin film usable in a vacuum environment and the thin film comes into contact with part of the filament 110. "Usable in a vacuum environment" means being usable at a degree of vacuum inside the analog amplification vacuum tube 100. For example, a carbon-based material, an aluminum or magnesium thin film may be used. Although the thin film in contact with the filament 110 may have a width on the order of 0.5 to 2 mm, the thin film need not be limited to this width, but may be determined as appropriate. The direction of contact may be a direction in which the filament is pushed up from the glass substrate 125 side or a direction in which the filament is pushed down to the glass substrate 125 side. Furthermore, the force at the time of contact may be adjusted as appropriate to a level at which vibration is easily attenuated.

As described above, the filament 110 includes a fixing part (intermediate filament fixing part 113) where a positional relationship with the anode 120-1 or 120-2 is constant and a movable part (welding point 112) fixed, via an elastic body (plate spring 117), to a member (anchor body 116) where a positional relationship with the anode 120-1 or 120-2 is constant. In this case, the vibration-proof parts 160-1 and 160-2 may be configured to come into contact with the filament 110 in the vicinity of the fixing part (position closer to the fixing part than the anode). Such a configuration can prevent rubbing by linear movement of the filament 110 caused by vibration. In the example in FIG. 1, the thin film of one vibration-proof part 160-1 comes into contact with the filament 110 between the intermediate filament fixing part 113 and the part facing the one anode 120-1. The thin film of the other vibration-proof part 160-2 comes into contact with the filament 110 between the intermediate filament fixing part 113 and the part located facing the other anode 120-2.

The filament 110 is heated with a DC current flowing therethrough and heated to a predetermined temperature or higher at which thermalelectrons can be emitted. However, at the welding point 112 and the intermediate filament fixing part 113, heat is transferred to the filament support member 111 and the intermediate filament support member 119, and so the filament 110 cannot be heated, in that vicinity, to a predetermined temperature or higher at which thermalelectrons can be emitted. Therefore, the respective centers of the grids 130-1 and 130-2 face positions at ¼ of a distance from one end of the filament 110 (one welding point 112), and the intermediate filament fixing part 113 may be located at a position ½ of the length of the filament 110 (midpoint between the two welding points 112). Furthermore, the vibration-proof parts 160-1 and 160-2 may be disposed in the vicinity of the intermediate filament fixing part 113 (fixing part of the filament 110) within a range in which vibration can be attenuated. In such an arrangement, the filament 110 at the position facing the anode 120-1 or 120-2 can be located farthest from the filament support member 111 and the intermediate filament support member 119, and it is thereby possible to emit enough thermalelectrons from the filament 110.

Figure 9:
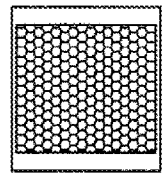
FIG. 9 is a diagram illustrating an example of a shape of a grid.

FIG. 9 illustrates an example of a shape of the grid. The grid 130 has a mesh-like shape and may be formed of a SUS or the like. As described above, description of part of the grid 130 is omitted to clearly illustrate the anodes 120-1 and 120-2 in FIG. 1. The actual grid 130-1 or 130-2 is the grid 130 shown in FIG. 9. The grids 130-1 and 130-2 are fixed to the grid support members 132-1 and 132-2. The distance between the anode 120-1,120-2 and the grid 130-1,130-2 and the distance between the filament 110 and the grid 130-1,130-2 are determined by thicknesses of the grid support members 132-1 and 132-2.

That is, the analog amplification vacuum tube 100 achieves the configuration of the anode 120-1,120-2 and the grid 130-1,130-2 having a distance (first predetermined distance) of 0.15 mm or more and 0.35 mm or less by using the grid support members 132-1 and 132-2. The analog amplification vacuum tube 100 also achieves the configuration of the filament 110 and the grid 130-1,130-2 having a distance (second predetermined distance) of 0.2 mm or more and 0.6 mm or less by using the filament support member 111, the intermediate filament support member 119 and the grid support members 132-1 and 132-2.

Figure 10:
FIG. 10 is a diagram illustrating a gettering.

FIG. 10 illustrates a gettering 140. The gettering 140 performs flash by high frequency induction heating and causes a metal barium film to be vapor-deposited to part of the inside of the case 180 and thereby plays a role in increasing or maintaining a degree of vacuum. A getter shield 142 is a member for shielding the gettering 140 from the filament 110, the grids 130-1 and 130-2, and the anodes 120-1 and 120-2. In the case of a vacuum fluorescent display, regardless of the location of the gettering in the case, influences on the characteristic of display device can be ignored, and therefore the position of the gettering need not be taken into consideration from the standpoint of characteristics. However, when the two sets of anodes 120-1 and 120-2 and grids 130-1 and 130-2 are used as amplifiers for stereo signals, it has been discovered that influences of the gettering 140 cannot be ignored to match characteristics of the two sets of amplifiers. Therefore, the gettering 140 is preferably disposed equidistantly from the grids 130-1 and 130-2 to match characteristics of the two sets of amplifiers.

Figure 11:
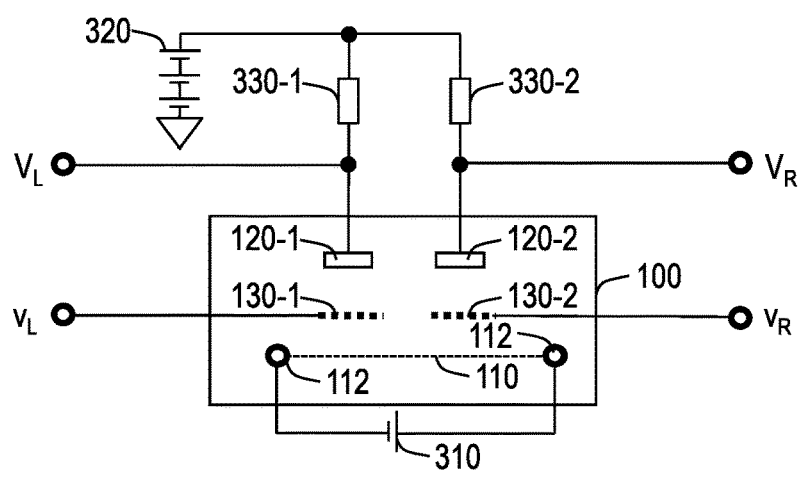
FIG. 11 is a diagram illustrating an example of an amplification circuit using the analog amplification vacuum tube.

FIG. 11 illustrates an example of an amplification circuit using the analog amplification vacuum tube 100. The filament 110 is connected to a DC voltage source 310 (e.g., 0.7 V) whereby the filament 110 is heated to a predetermined temperature (e.g., 650 degrees) at which thermalelectrons are emitted. An anode voltage source 320 is applied to the anodes 120-1 and 120-2 via resistors 330-1 and 330-2 respectively. For example, a signal $v_L$ of a left channel of a stereo to which a predetermined bias is applied is inputted to the grid 130-1 and a signal $v_R$ of a right channel of the stereo to which the same bias is applied is inputted to the grid 130-2. In this case, the voltage $V_L$ of the anode terminal 121-1 is the output of the left channel and the voltage $V_R$ of the anode terminal 121-2 is the output of the right channel.

<Effect and Material of Vibration-Proof Part>

Figure 12A:
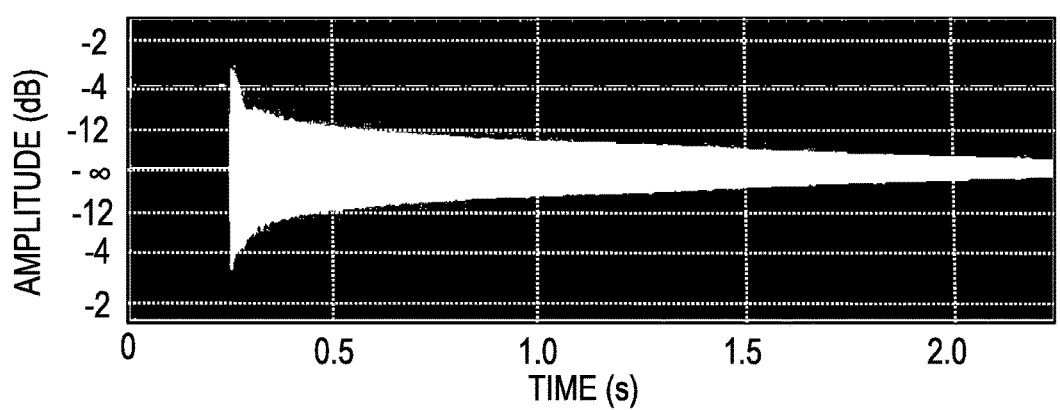
FIG. 12A is a diagram illustrating a change in influences of filament vibration on output of the amplification circuit and is a diagram illustrating influences when no vibration-proof part is provided.
Figure 12B:
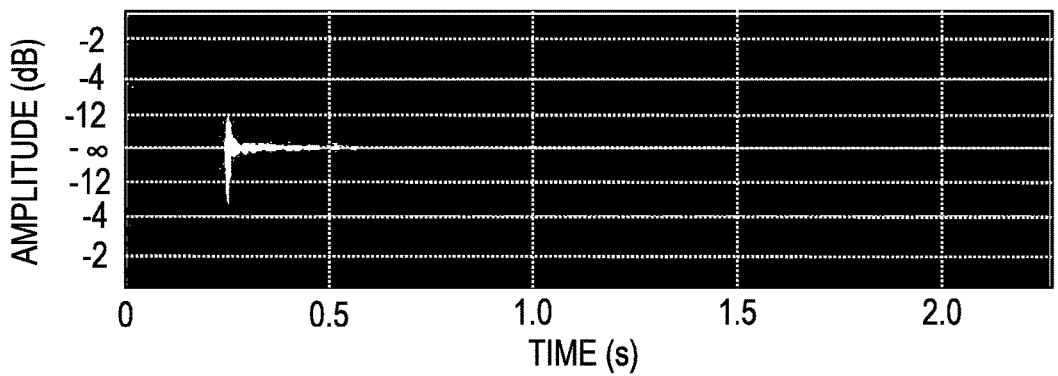
FIG. 12B is a diagram illustrating a change in influences of filament vibration on output of the amplification circuit and is a diagram illustrating influences when a vibration-proof part is provided.

Since the analog amplification vacuum tube 100 uses the amplification circuit shown in FIG. 11, if the filament 110 vibrates, the distance between the filament 110 and the anode 120-1 or 120-2 changes, which may affect amplification characteristics. FIG. 12A and FIG. 12B illustrate changes in influence of filament vibration on the output of the amplification circuit. FIG. 12A illustrates a case where no vibration-proof part is provided and FIG. 12B illustrates a case where a vibration-proof part including a graphite thin film is provided. The graphite thin film has a thickness of 0.1 mm and a width of contact with the filament of on the order of 1.5 mm. The horizontal axis represents time (seconds) and the vertical axis represents a change in amplitude since vibration is applied. When no vibration-proof part is provided, it is observed that the vibration is not sufficiently attenuated in two seconds or more. On the other hand, when the graphite thin film is brought into contact with the filament 110, it is observed that vibration is immediately attenuated and a state where there is substantially no vibration is restored in 0.2 seconds or so.

Figure 13:
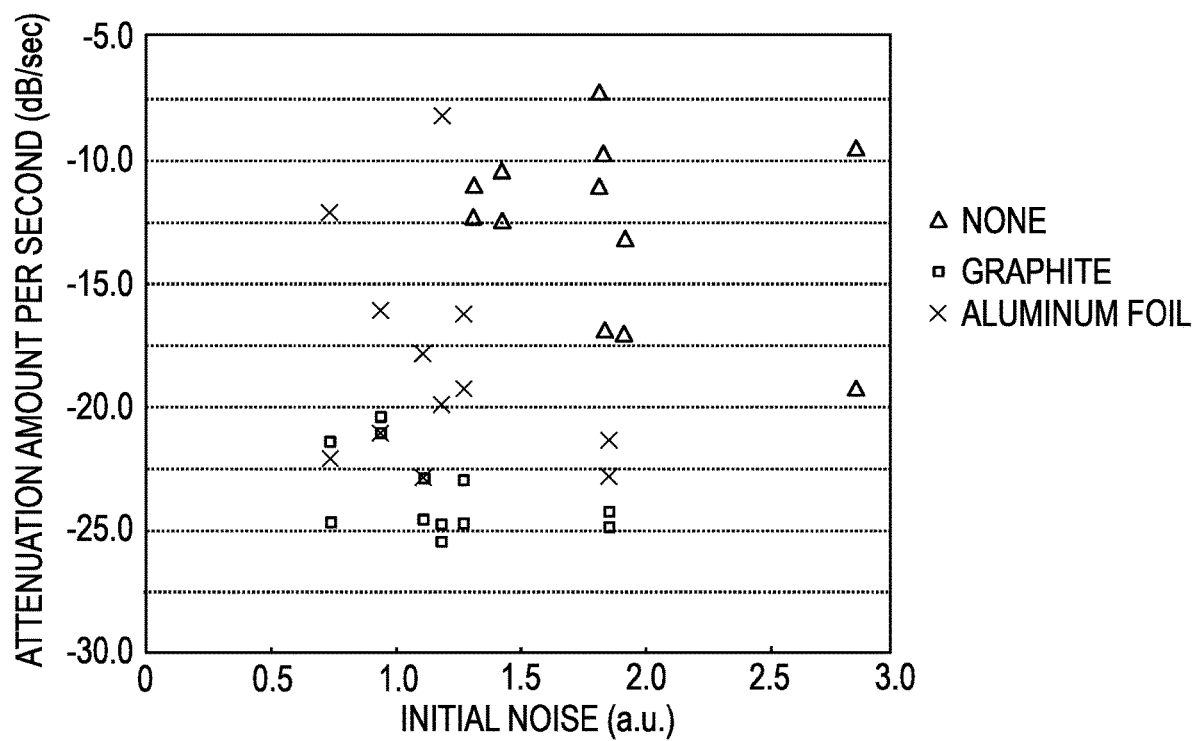
FIG. 13 is a diagram illustrating results of investigation of magnitude and an attenuation amount per second of initial noise caused by vibration when different materials are used for a thin film.

FIG. 13 illustrates results of investigation of magnitude and attenuation amount per second of initial noise caused by vibration when different materials are used for a thin film. Triangles show cases where no vibration-proof part is provided, squares show cases where a graphite thin film is provided and x marks show cases where an aluminum foil is used as the thin film. The graphite thin film has a thickness of 0.1 mm and a width of contact with the filament of on the order of 1.5 mm. A common aluminum foil is used for the general aluminum foil. More specifically, the aluminum foil has a thickness of 12 µm, and a width of contact with the filament of on the order of 1.5 mm. The horizontal axis represents initial noise (arbitrary unit) generated in the amplification circuit and the vertical axis represents an attenuation amount per second. It is observed that when the vibration-proof part using a graphite thin film or an aluminum foil is provided, initial noise is smaller and attenuation occurs more quickly than when no vibration-proof part is provided. That is, depending on a selection of a material, it may be possible to improve attenuation characteristics and providing at least the vibration-proof part may improve the attenuation characteristics compared to the configuration in which no vibration-proof part is provided. Therefore, if the material is one, which is usable in an environment with a high degree of vacuum and with which a thin film can be formed, it is possible to increase the attenuation factor of filament vibration without being limited to graphite or aluminum. For example, a carbon-based material other than graphite (diamond-like carbon, carbon nanotube, and the like) or magnesium may be used. The graphite thin film may be created by subjecting a resin sheet to high heat treatment and compressing graphite powder or the graphite thin film may be formed by printing or applying graphite paste onto a metal plate.

Note that influences of filament vibration on the characteristics have also been pointed out in vacuum fluorescent displays and various countermeasures are being proposed. However, since the vacuum fluorescent displays are different from the analog amplification vacuum tube, which is the target of the present invention in the following ways, the countermeasures for the vacuum fluorescent displays cannot be used for the analog amplification vacuum tube. Since humans visually recognize the brightness of the vacuum fluorescent displays, humans can recognize vibration on the order of 50 Hz, but cannot recognize vibration on the order of 100 Hz or higher. Therefore, in the case of the vacuum fluorescent displays, it is sufficient to prevent vibration below 100 Hz. On the other hand, in the case of the analog amplification vacuum tube assumed to be used in music, since humans auditorily recognize outputted sound, humans can recognize vibration even above 100 Hz. In the case of the analog amplification vacuum tube, in order make it difficult for humans to recognize vibration, it is necessary to prevent vibration at 10 kHz or below or 20 kHz or below. In the case of the vacuum fluorescent displays, when the temperature over a range of the filament facing the anode is not uniform, unevenness is generated in the brightness of the vacuum fluorescent display. Therefore, in the case of the vacuum fluorescent display, it is necessary to keep the temperature over the range of the filament facing the anode uniform as a countermeasure for preventing vibration. On the other hand, for use in music (for analog amplification), although it is necessary to match characteristics between the left channel and the right channel, unevenness in the brightness does not relate to the characteristics, and so it is unnecessary to make the temperature over the range of the filament facing the anode uniform. In addition, the vibration-proof part may be visually noticeable. Thus, the present invention provides a width by using a thin film to bring the thin film into contact with the filament. In the case of the present invention, the temperature cannot be made uniform since this will widen the range below the temperature of the filament, but it is possible to attenuate vibration at higher frequency than frequencies in the vibration-proof countermeasures for the vacuum fluorescent displays.

[Modification 1]

Figure 14:
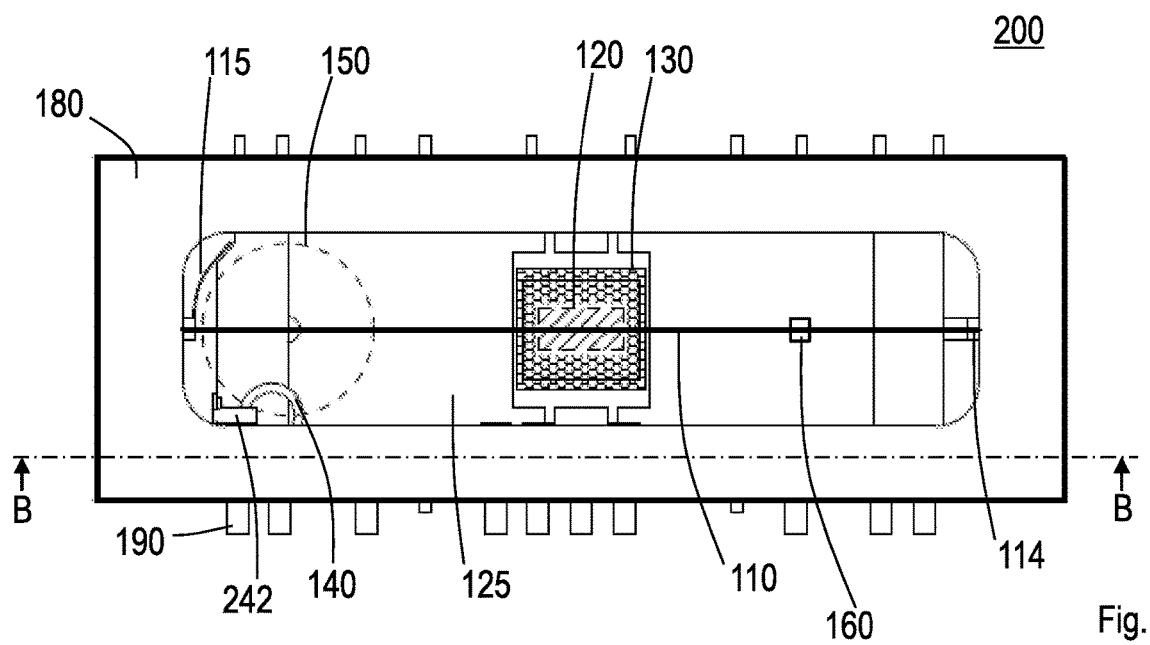
FIG. 14 is a plan view of an analog amplification vacuum tube according to a modification.
Figure 15:
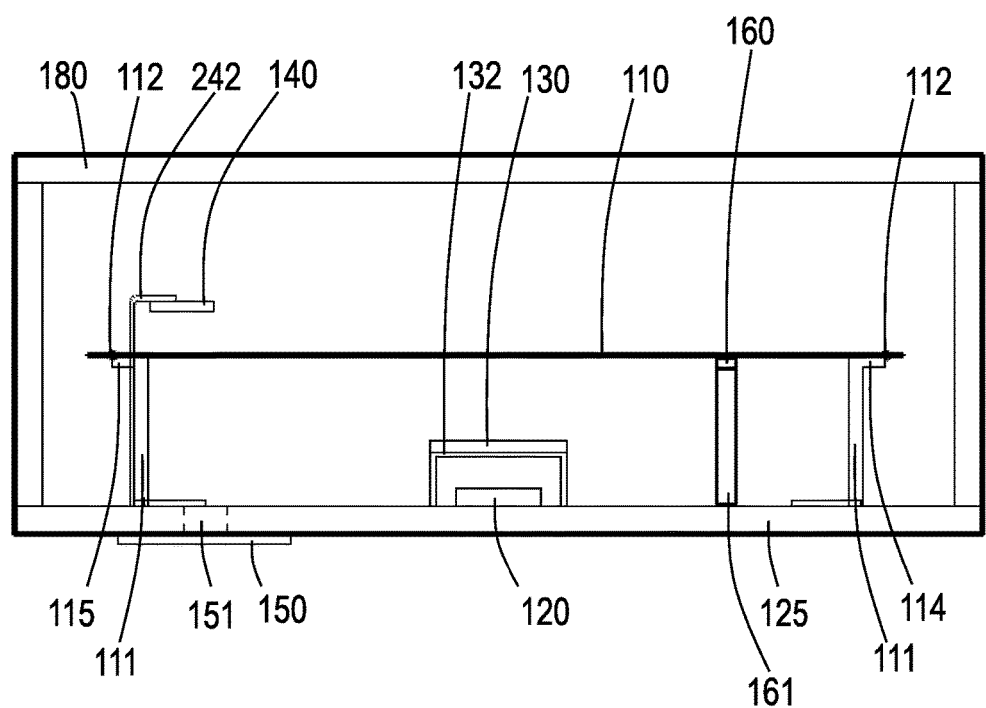
FIG. 15 is a cross-sectional view along a line B-B in FIG. 14.

FIG. 14 shows a plan view of an analog amplification vacuum tube according to a modification and FIG. 15 shows a cross-sectional view along a line B-B in FIG. 14. An analog amplification vacuum tube 200 is different from the analog amplification vacuum tube 100 in that there is only one set of the anode 120, the grid 130 and the vibration-proof part 160, in the position of the gettering 140 and in the method of fixing the filament 110. Although part of the grid 130 is not described in FIG. 14 either to make the position of the anode 120 clear, the grid 130 is the same as that in FIG. 9. Since there is only one set of the anode 120 and the grid 130 in the analog amplification vacuum tube 200, the position of the gettering 140 need not be limited to adjust characteristics. Thus, the gettering 140 is set as being held to a gettering support member 242 at an end of the analog amplification vacuum tube 200.

In the analog amplification vacuum tube 200, the anchor 115 is attached to only one filament support member 111. In the case of the filament support member 111 to which no anchor 115 is attached, the filament 110 may be fixed to a filament fixing part 114 of the filament support member 111 by welding or the like. In this case, the fixing part where a positional relationship with the anode 120 is constant, corresponds to the filament fixing part 114. The movable part fixed to the member (anchor body 116) via an elastic body (plate spring 117) where a positional relationship with the anode 120 is constant, corresponds to the welding point 112 on the side on which the anchor 115 is attached. The vibration-proof part 160 is disposed closer to the fixing part (filament fixing part 114) than the anode 120.

DESCRIPTION OF REFERENCE NUMERALS 100, 200 analog amplification vacuum tube
110 filament
111 filament support member
112 welding point
113 intermediate filament fixing part
114, 118 filament fixing part
115 anchor
116 anchor body
117 plate spring
119 intermediate filament support member
120 anode
121 anode terminal
122 anode wiring
125 glass substrate
126 insulating layer
127 anode opening
128 terminal opening
130 grid
132 grid support member
140 gettering
142 getter shield
150 exhaust hole plug
151 exhaust hole
160 vibration-proof part
161 vibration-proof support member
180 case
190 terminal
242 gettering support member
310 DC voltage source
320 anode voltage source
330 resistor

What is claimed is:

1. An analog amplification vacuum tube comprising:
a filament tensioned linearly and emitting thermalelectrons;
an anode disposed parallel to the filament;
a grid disposed between the filament and the anode so as to face the anode; and
a vibration-proof part comprising a thin film usable in a vacuum environment, the thin film coming into contact with part of the filament, wherein
the filament comprises a fixing part where a positional relationship with the anode is constant, and a movable part fixed, via an elastic body, to a member where a positional relationship with the anode is constant, and
the thin film of the vibration-proof part comes into contact with the filament at a position closer to the fixing part than the anode.

2. The analog amplification vacuum tube according to claim 1, wherein a width of the thin film in contact with the filament is 0.5 mm or more and 2 mm or less.

3. The analog amplification vacuum tube according to claim 1, wherein the thin film is a thin film made of carbon-based material, aluminum or magnesium.

4. The analog amplification vacuum tube according to claim 1, wherein the thin film is a graphite thin film.

5. An analog amplification vacuum tube comprising:
a filament tensioned linearly and emitting thermalelectrons; and
two sets of a grid and an anode, wherein
both of the anodes are formed on a same surface on a planar substrate,
the filament is disposed parallel to the planar substrate at a position facing both of the anodes,
each of the grids is disposed between the anode and the filament so as to face a same set of the anodes at a first predetermined distance and so as to have a second predetermined distance from the filament,
the analog amplification vacuum tube comprises:
an intermediate filament fixing part that fixes the filament at a position corresponding to an intermediate point between the anodes of the two sets; and
two vibration-proof parts comprising a thin film usable in a vacuum environment,
the thin film of one of the vibration-proof parts is in contact with the filament between the intermediate filament fixing part and a part facing one of the anodes, and the thin film of another of the vibration-proof parts is in contact with the filament between the intermediate filament fixing part and a part facing another of the anodes.

6. The analog amplification vacuum tube according to claim 5, wherein the thin film is a thin film made of carbon-based material, aluminum or magnesium.

7. The analog amplification vacuum tube according to claim 5, wherein the thin film is a graphite thin film.

8. The analog amplification vacuum tube according to claim 5, wherein a width of the thin film in contact with the filament is 0.5 mm or more and 2 mm or less.

9. An analog amplification vacuum tube comprising:
a filament tensioned linearly and emitting thermalelectrons;
an anode disposed parallel to the filament;
a grid disposed between the filament and the anode so as to face the anode; and
a vibration-proof part comprising a thin film usable in a vacuum environment, the thin film coming into contact with part of the filament, wherein the thin film is a thin film made of carbon-based material, aluminum or magnesium.

10. An analog amplification vacuum tube comprising:
a filament tensioned linearly and emitting thermalelectrons;
an anode disposed parallel to the filament;
a grid disposed between the filament and the anode so as to face the anode; and
a vibration-proof part comprising a thin film usable in a vacuum environment, the thin film coming into contact with part of the filament, wherein the thin film is a graphite thin film.

* * * * *